United States Patent [19]

Hilby

[11] Patent Number: 5,495,204
[45] Date of Patent: Feb. 27, 1996

[54] DIGITAL FM DEMODULATOR AND METHOD WITH ENHANCED RESOLUTION

[75] Inventor: Timothy R. Hilby, Antioch, Calif.

[73] Assignee: BEI Electronics, Inc., San Francisco, Calif.

[21] Appl. No.: 358,321

[22] Filed: Dec. 19, 1994

[51] Int. Cl.$^6$ ...................................................... H03D 3/00
[52] U.S. Cl. ............................. 329/318; 329/341; 455/214; 375/328
[58] Field of Search .................................. 329/300, 302, 329/303, 304, 306, 310, 315, 318, 323, 341, 343, 345, 346; 455/205, 214, 337; 375/324, 328

[56] References Cited

U.S. PATENT DOCUMENTS

| | | | |
|---|---|---|---|
| 3,571,712 | 3/1971 | Hellwarth | 329/302 |
| 3,636,454 | 1/1972 | Pasternack et al. | 329/302 |
| 4,541,105 | 9/1985 | Lee et al. | 377/19 |

*Primary Examiner*—Siegfried H. Grimm
*Attorney, Agent, or Firm*—Flehr, Hohbach, Test, Albritton & Herbert

[57] ABSTRACT

Digital FM demodulator and method in which zero-crossings of a frequency modulated input signal are detected, a binary pulse is provided for each of the zero-crossings, and the binary pulse stream is filtered digitally to provide enhanced resolution of the incremental phase (frequency) of the input signal over a period which is asynchronous with the input signal. In the disclosed embodiments, the digital filtering is done with comb decimation filters, with a higher order filter being employed where greater resolution is desired.

16 Claims, 4 Drawing Sheets

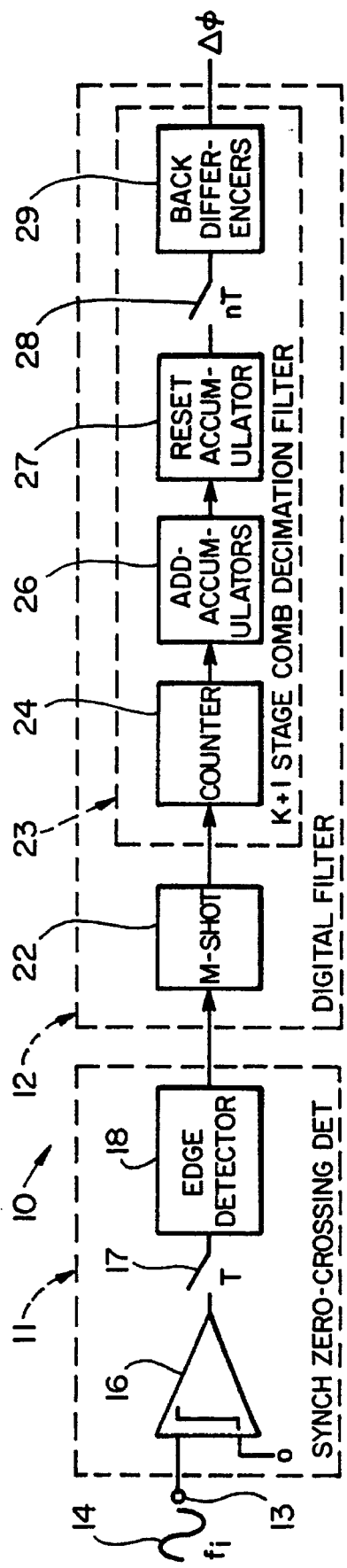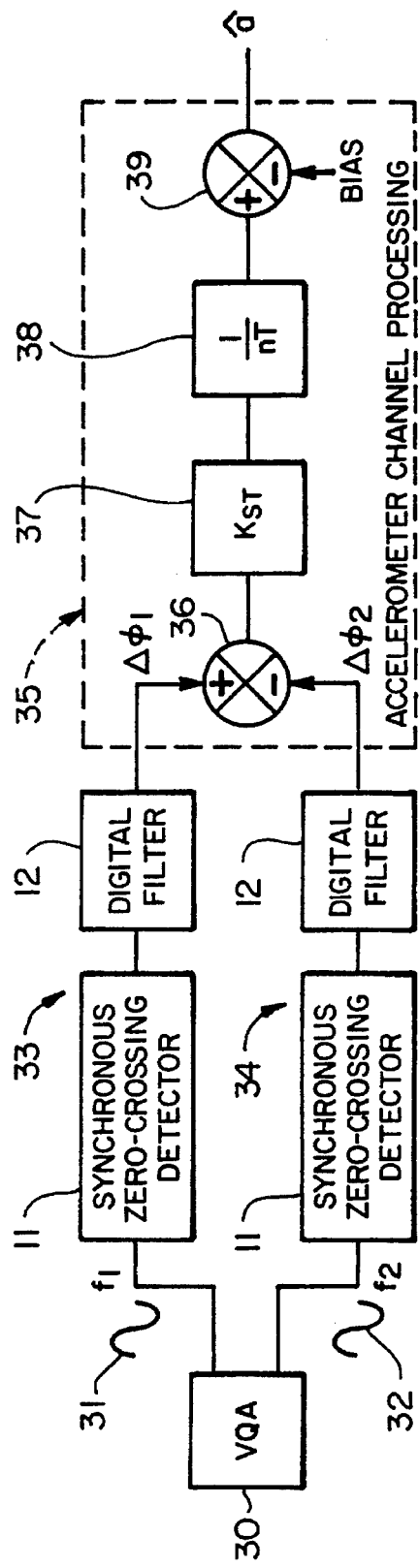
FIG_1
FIG_4

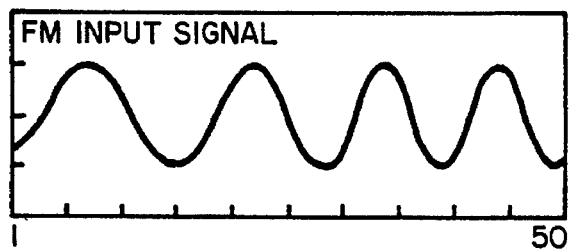
FIG_2A
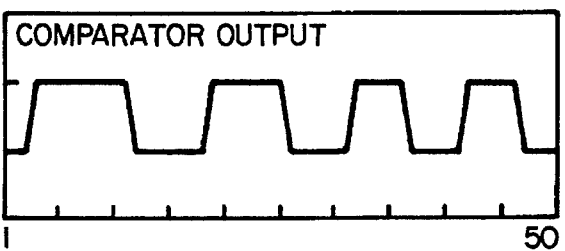
FIG_2B
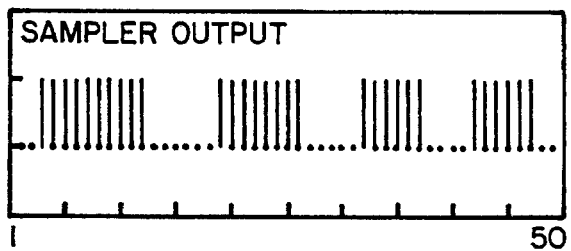
FIG_2C
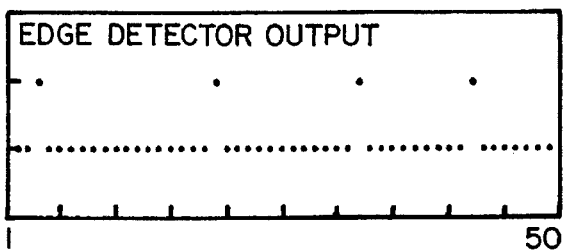
FIG_2D
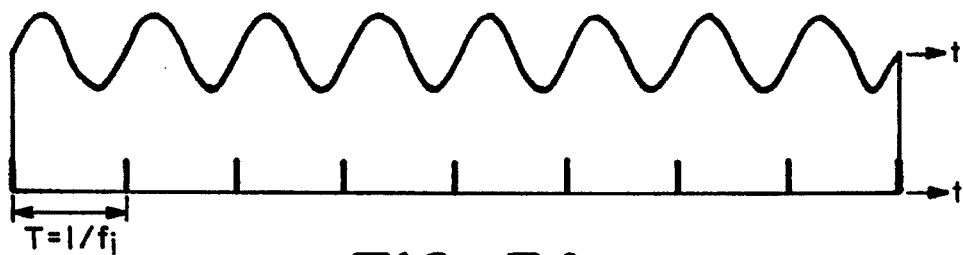
FIG_3A
FIG_3B

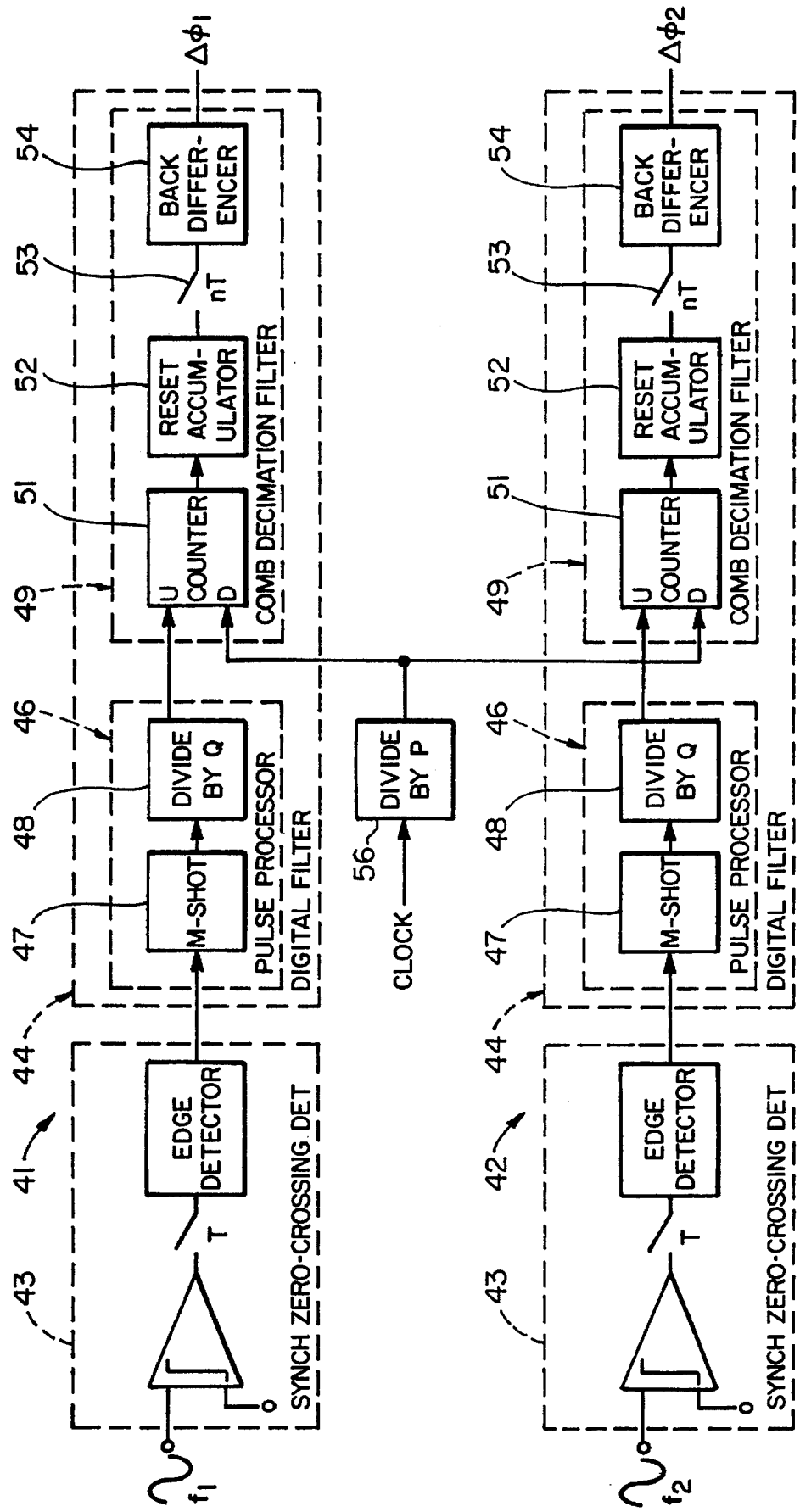
FIG_5

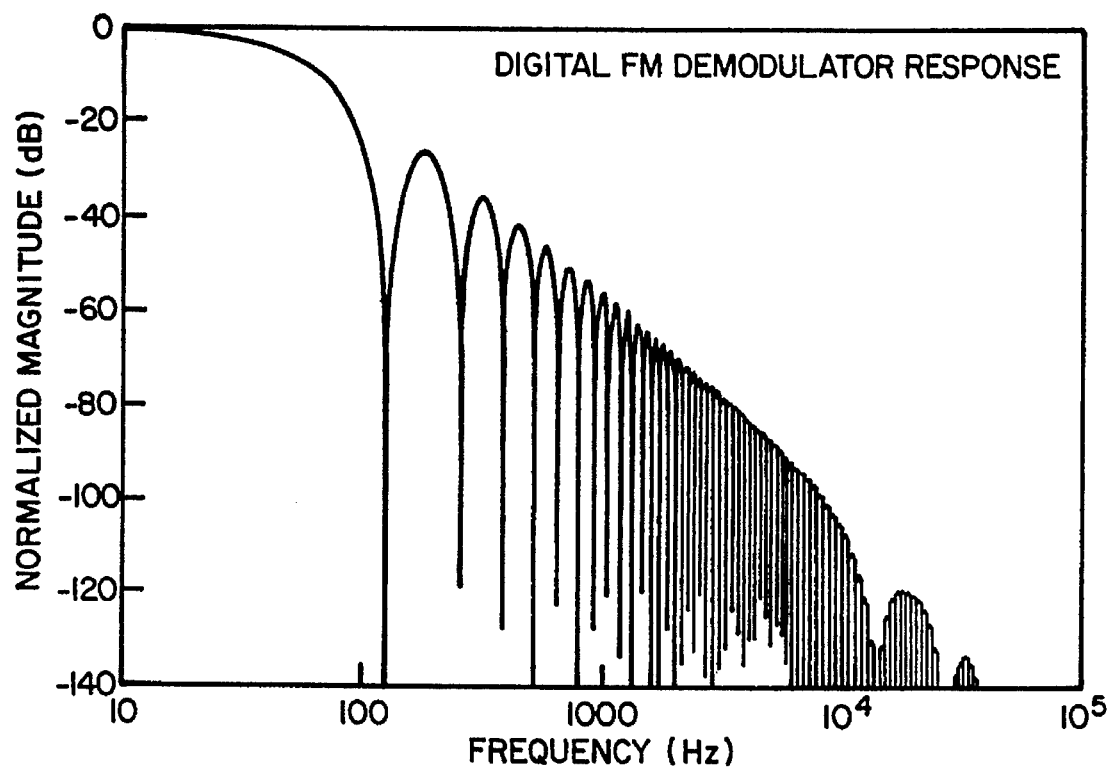
FIG_6
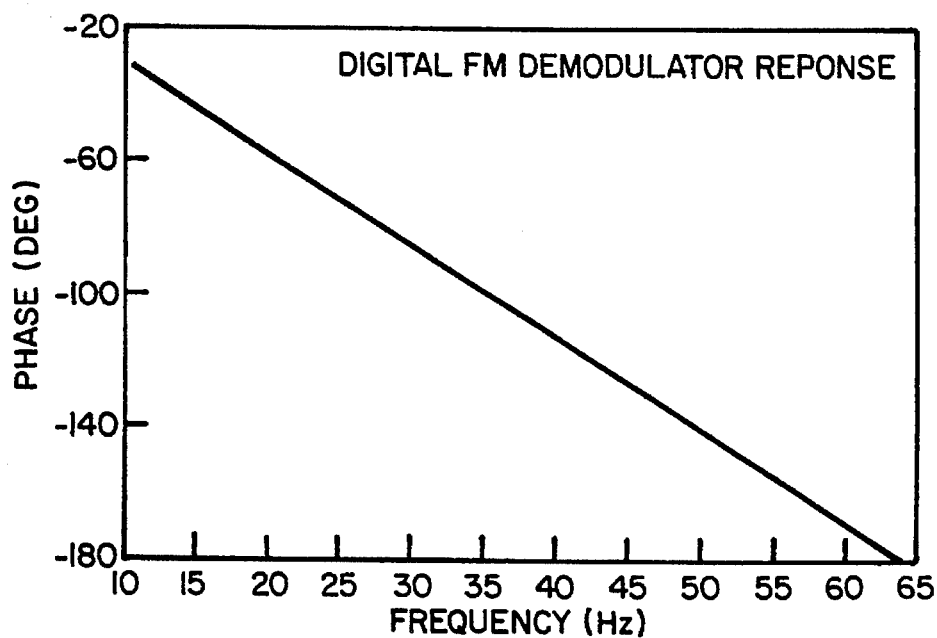
FIG_7

DIGITAL FM DEMODULATOR AND METHOD WITH ENHANCED RESOLUTION

This invention relates generally to devices which convey information by variations in the frequency of an output signal (frequency output devices) and, more particularly, to a digital FM demodulator and method which are particularly suitable for use in a frequency output accelerometer.

One type of accelerometer heretofore provided is a vibrating quartz accelerometer (VQA). The VQA is a common mode frequency output device in which changes in acceleration act to differentially change the natural frequencies of two resonating crystals. The two crystals are arranged such that a linear acceleration will cause one crystal to be placed in tension while the other crystal is placed in compression, with the natural frequency of the crystal under tension increasing and the natural frequency of the crystal in compression decreasing. The differential frequency sensitivity to acceleration of these crystals is typically on the order of 10 Hz/g. Since a change in frequency corresponds to a change in acceleration, an incremental change in phase will correspond to an incremental change in velocity. Thus, each cycle (360 degrees) of the FM input signals will correspond to about one m/sec of incremental velocity. In order to resolve smaller velocity increments, it is necessary to resolve fractional cycles of the FM input signals.

To improve resolution, phase-locked loop (PLL) techniques have heretofore been incorporated in some frequency-output accelerometers. However, PLL techniques have several drawbacks. The noise performance associated with the analog electronics of the PLL components must be considered and overcome in every design, The analog components of the PLL can drift over time and temperature. The PLL is a nonlinear system which is locally, but not globally stable. If the phase detector portion of the PLL is saturated, loss of lock can result, and one or more velocity pulses can be lost.

Another technique heretofore used to improve resolution of the incremental velocity is counter-based. However, counter-based methods tend to alias a substantial portion of the carrier phase noise resulting in a noisier reproduction of the information content of the input signal. One example of a counter-based method is discussed in U.S. Pat. No. 4,541,105.

It is in general an object of the invention to provide a new and improved FM demodulator and method.

Another object of the invention is to provide an FM demodulator and method of the above character which overcome the limitations and disadvantages of the techniques heretofore employed for demodulating FM signals.

Another object of the invention is to provide an FM demodulator and method of the above character which are particularly suitable for use in accelerometers and other inertial sensing devices with frequency outputs.

These and other objects are achieved in accordance with the invention by detecting zero-crossings of a frequency modulated input signal, producing a binary pulse for each of the zero-crossings, and digitally filtering the binary pulse stream to provide enhanced resolution of the incremental phase (average frequency) of the input over a period which is asynchronous with the input. The digital filtering is done with a decimation filter, with a higher order filter being employed where greater resolution is desired. Compared with the phase-locked loop techniques and counter-based techniques of the prior art, this provides improved phase resolution and noise performance with the attendant advantages of stability, cost, and high yield inherent in digital design.

FIG. 1 is a functional block diagram of one embodiment of a digital FM demodulator according to the invention.

FIGS. 2A–D are waveform diagrams, illustrating signals at different points in the of an incremental phase sample into 360 degree increments in the embodiment of FIG. 1.

FIG. 3A is graphical representation of a pulse train produced by quantization embodiment of FIG. 1.

FIG. 3B is a graphical representation of the Fourier transform of the pulse train of FIG. 3A.

FIG. 4 is a functional block diagram of an embodiment of a frequency output accelerometer with a digital FM demodulator according to the invention.

FIG. 5 is a functional block diagram of another embodiment of a digital FM demodulator incorporating the invention for use in a frequency output accelerometer.

FIG. 6 shows the normalized magnitude response (in dB) of the embodiment of FIG. 5.

FIG. 7 shows the phase response (in degrees) of the embodiment of FIG. 5.

As illustrated in FIG. 1, the digital FM demodulator 10 comprises a synchronous zero-crossing detector 11 and a digital filter 12. The system has an input port 13 to which an input signal 14 having a continuously varying frequency $f_i$ is applied. In the particular embodiment illustrated, the zero-crossing detector detects positive-going zero crossings, but the demodulator could just as well be implemented with a negative-going zero-crossing detector, or a detector which responds to both positive- and negative-going zero crossings.

The zero-crossing detector comprises a comparator 16, with the input signal being applied to one input of the comparator and a zero reference signal being applied to a second, or reference, input. The output of the comparator is sampled at a rate $f_s=1/T$, where $f_s$ is the system clock rate and is substantially greater than $f_i$. In the drawing, the sampler is represented schematically by a switch 17, but any suitable sampling circuit of known design can be employed. The sampled signal is applied to the input of an edge detector 18 which delivers a single binary output pulse in response to each positive-going transition in the input signal. The input signals and the signals at the outputs of the comparator, the sampler and the edge detector are shown in FIGS. 2A–2D.

As illustrated in FIG. 3A, the zero-crossing detector quantizes the incremental phase sample into 360 degree increments and creates a pulse train with each pulse corresponding to an additional cycle of the input signal. Over a very long time, the average density of the pulses (pulses/sec or counts/sec) will correspond to the average frequency of the input signal. If the pulse train is transformed to the frequency domain using a Fourier transform, a corresponding plot, as shown in FIG. 3B, contains nearly equal spectral components at baseband as well as at all harmonics of the fundamental of the FM input signal. The average frequency (signal information) is concentrated in the baseband component, while the 360 degree quantizing noise is concentrated in the fundamental and its harmonics. Generally speaking, to the extent that the fundamental and higher harmonics may be rejected by filtering, the average frequency resolution of the FM demodulator may be improved.

The zero-crossing detector operates on a discrete time basis and can be thought of as sampling the FM input signal at a sampling rate (1/T), with the result of each sample being either a zero-crossing detection or no zero-crossing detection. This sampling effectively subdivides the FM input waveform into a plurality of system clock cycles (T). For a "noiseless" FM input signal, the zero-crossing will be detected within +1 sampling clock cycle (T) of the event, and this timing uncertainty will be equivalent to a uniformly distributed phase measurement error (noise):

$$-2\pi\left(\frac{f_i}{f_s}\right) < \partial\phi_{clock} < 0$$

In contrast to the 360 degree phase quantizing noise, the phase measurement noise due to sampling may be expected to be distributed throughout the baseband frequencies of interest. For this reason, a system sampling clock rate ($f_s$) must be chosen to effectively reduce the phase measurement noise due to sampling to a value below the desired FM demodulator output incremental phase quantization level.

The signal at the output of the zero-crossing detector is applied to the digital filter 12 which removes the fundamental and higher harmonics of the modulation component of input signal 14. The digital filter includes an m-shot pulse generator 22 which is triggered by the signal from the zero-crossing detector. The M-shot generates m pulses in response to each trigger pulse, where m is a positive integer. The period of the m-shot pulses is $T=1/f_s$ because of the synchronous nature of the system. The transfer of the m-shot may be written as:

$$G_{m\text{-}shot}(z) = \left(\frac{1-z^{-m}}{1-z^{-1}}\right)$$

where, $z=e^{sT}$ and s is the Laplace operator ($\sigma+j\omega$).

The gain of the m-shot pulse generator is:

$$|G(f)| = \left(\frac{\sin(m\pi fT)}{\sin(\pi fT)}\right)$$

The phase contribution of the m-shot pulse generator 22 (exclusive of pipelining and transport delays) is:

$$\angle G(f) = -\pi fT(m-1)$$

The m-shot is designed so that the $m^{th}$ pulse out of it occurs before the next trigger signal from the zero-crossing detector. Thus, $$mT < \frac{1}{f_{i(max)}}$$

where, $f_{i(max)}$=maximum FM input frequency, and the limit on the number of pulses out of the m-shot is:

$$m < \frac{f_s}{f_{i(max)}}$$

Thus, for example, if the maximum FM input frequency is 13 kHz and the system clock frequency is 8 MHz, then the maximum permissible number of pulses out of the m-shot is 615. In actual implementation, the maximum rejection of the FM fundamental signal is achieved by setting m close to its maximum permissible value.

The pulses from m-shot 22 are applied to a (k+1)-stage comb decimation filter 23 which comprises a counter 24, k–1 stages of multi-bit add-accumulators 26, a reset-accumulator 27, a down sampler 28 and k stages of back-differencers 29. In this particular embodiment, k is a positive integer, and down sampler 28 is represented schematically as a switch.

Counter 24 counts the pulses from m-shot 22, and has the following transfer function:

$$G_{counter}(z) = \left(\frac{1}{1-z^{-1}}\right)$$

The multi-bit output of counter 24 is applied to the input of add-accumulators 26 which have the following transfer function:

$$G_{add\text{-}accumulators}(z) = \left(\frac{1}{1-z^{-1}}\right)^{k-1}$$

Utilizing multiple stages of add-accumulators 26 increases the order of the digital filter 12. The add-accumulators are desirable for higher resolution performance, and provide a multi-bit addition-accumulation function (at frequency $f_s$) at each one of the k–1 stages.

The output of the add-accumulator stages is applied to the input of reset-accumulator 27 which provides an addition-accumulation at frequency $f_s$ and resets itself at a frequency $f_s/n$, where n is a positive integer. The action of the reset-accumulator 27 is thus similar to that of the add-accumulators 26; however, in contrast to the add-accumulators which are never reset, the reset-accumulator is periodically reset to zero at an interval nT. Before resetting, however, reset-accumulator 27 provides the accumulated counts to the back-differencers 29 via down sampler 28. The down sampler thus samples the signal from the reset-accumulator at the interval nT.

The back-differencers 29 compute the $k^{th}$ order back-difference of the signal from down sampler 28 at regular periodic intervals nT:

$$y_i^{(1)} = x_i - x_{i-1}$$

$$y_i^{(2)} = y_i^{(1)} - y_{i-1}^{(1)}$$

$$y_i^{(k)} = y_i^{(k-1)} - y_{i-1}^{(k-1)},$$

where $x_i$ and $x_{i-1}$ represent the present input and the input immediately preceding the present input to the first stage of the back differencer, and $y_i$ and $y_{i-1}$ represent the present output and the output immediately preceding the present output at each stage of the back-differencers. The numbers in parentheses ((1), (2), ..., (k–1), (k)) represent the stages of the back differencer, with the lower numbered stages being closer to the input.

The counter 24, add-accumulators 26, reset-accumulator 27, and back-differencers 29 are implemented using two's complement or "wrap-arithmetic". This allows any internal stage of the filter to overflow as long as the output of the filter itself cannot overflow. This can be accomplished by establishing a data path width which is wide enough to prevent the output from overflowing for the maximum and minimum input frequencies, and in the embodiment illustrated, the counter, add-accumulators, reset-accumulator and back-differencers are designed according to this data path width.

The back-differencers 29 produce an output which is proportional to incremental phase (or average frequency $\Delta\phi/nT$). The combination of counter 24, k–1 stage add-accumulators 26, reset-accumulator 27, down sampler 28, and k stage back-differencers 29 make up a $(k+1)^{th}$ order comb decimation filter which has the following transfer function:

$$G(z) = \left( \frac{1-z^{-n}}{1-z^{-1}} \right)^{k+1}$$

The gain of the $(k+1)^{th}$ order comb decimation filter is:

$$|G(f)| = \left( \frac{\sin(n\pi fT)}{\sin(\pi fT)} \right)^{k+1}$$

The phase of the (k+1)th order comb decimation filter (exclusive of pipelining and transport delays) is given by:

$$\angle G(f) = -(k+1)\pi fT(n-1)$$

The comb decimation filter has several advantages over other filters. If the comb decimation filter is scaled properly for unity gain and if two's complement or "wrap around" arithmetic is used, the add-accumulations can be performed at the system clock frequency $f_s$, the back-differences can be done at the lower decimation rate (1/nT), and accumulator overflows will not cause any errors. No aliasing to DC can occur with this type of filter since the filter places zeroes at all frequencies which would alias to DC after decimation. Thus, no net frequency estimation bias can result from the decimation. Also, since no multiplications are required, the filter may be implemented with digital add-accumulators, counters, reset-accumulators, and back-differencers. No storage is required for filter coefficients, and the need for intermediate storage is minimized by accumulating at the high sample rate (1/T) and differencing at the lower decimation rate (1/nT). In addition, the phase response of the filter is linear with frequency (constant group delay).

The order of the comb decimation filter, (k+1), is chosen to provide rejection of the spectral components at the FM input fundamental and its harmonics in accordance with the degree of resolution enhancement desired. The degree of enhancement is, however, limited by practical considerations. While increasing the order of the filter improves the resolution, additional stages require additional hardware and add group delay to the filter output. Also, since additional comb filter stages will increase the gain of the filter, the width of the data path will also increase with the order of the filter.

FIG. 4 illustrates a vibrating quartz accelerometer (VQA) in which the demodulator of FIG. 1 is employed. This system includes a transducer 30 with a pair of vibrating quartz crystals which produce FM signals 31, 32 at frequencies $f_1$, $f_2$, respectively.

The system includes a pair of signal processing channels 33, 34, each of which comprises a demodulator of the type illustrated in FIG. 1, with the outputs of the two channels $\Delta\phi_1$, $\Delta\phi_2$ being combined in an accelerometer processing channel 35 to provide an output signal â corresponding to the acceleration measured by the system. In the embodiment illustrated, the incremental phase signals $\Delta\phi_1$, $\Delta\phi_2$ are combined in a summation network 36, and the combined signal is adjusted by a scale factor $K_{SF}$ in a multiplier 37. The signal from the scale factor multiplier is multiplied by the decimation rate 1/nT in a circuit 38, and the signal from that circuit is adjusted for biasing error in a summation network 39 to provide the output signal â which corresponds to the measured acceleration.

FIG. 5 shows another embodiment of a dual channel demodulator for use in processing two FM signals such as the signals from the two piezoelectric sensors in a vibrating quartz accelerometer. As discussed more fully hereinafter, this embodiment has an additional advantage over other embodiments in that it uses a lesser number of data bits so that the width of the data path is reduced.

Each of the channels 41, 42 includes a synchronous, positive-going zero-crossing detector 43 similar to the positive-going zero-crossing detector 11 of FIG. 1. Each channel also includes a filter 44 to which the output of the zero-crossing detector is applied. This filter includes a pulse processor 46 comprising an m-shot pulse generator 47 a divide-by-q counter 48, and a decimation filter 49. As in the previous embodiments, the m-shot produces m pulses for every output pulse from the zero-crossing detector. However, this embodiment differs from the others in that the divide-by-q counter divides down the number of pulses produced by the m-shot, thereby reducing the range requirements in subsequent stages of the filter by a factor of q. A corresponding reduction in data path width may also be realized.

The pulses from the pulse processor are applied to the decimation filter 49. This filter comprises an up/down counter 51, a reset-accumulator 52, a down sampler 53 and a back-differencer 54. It is similar to the comb decimation filter 23 of FIG. 1, except for the up/down counter at the input and the fact that it has a reduced number of data bits.

In addition to dividing down the number of pulses from the m-shot, the width of the data path is also reduced by biasing each channel with a common-mode signal. This is done by dividing down the system clock with a divide-by-p counter 56 and applying the divided down clock signal to the down counting inputs of up/down counters 51. The divided down signals from the pulse processors are applied to the up counting inputs of these counters. The values of p and q are selected such that under conditions of no acceleration ($f_1 = f_2 = f_i$), the average frequency of the pulses applied to the up counting inputs is approximately the same as the average frequency of the pulses applied to the down counting inputs. The values m and q are also selected to provide the desired filter gain.

Since in this particular embodiment, k is set at 1, no add-accumulator is necessary (k−1=0), and only one back-differencer is employed in each channel (k=1). As one example, the embodiment of FIG. 5 might have the following parameters:
T=125 nsec ($f_s$=8 MHz)
n=62500 (accelerometer output sample frequency=128 Hz)
$f_i$=12000 Hz (unloaded crystal natural frequency)
$f_{i(max)}$=13000 Hz
$f_{i(min)}$=11000 Hz
m=615
q=26
p=28
k=1
data path width: 25 bits The number of parallel data bits in the counter and reset-accumulator sections of the filter is determined from the condition that the output of the filter must not be allowed to overflow in any single output sample period (nT). For the maximum and minimum input frequencies given in this example, the output will not overflow if the parallel data path is 25 bits in width.

A transfer function plot (i.e., FM demodulator output as a function of frequency input) for one channel of the embodiment of FIG. 5 is shown in FIG. 6. This plot shows a normalized magnitude response (in dB) and shows a rejection of nearly −120 dB in the quantization noise at the FM fundamental. Since the filter continues to "roll-off" with frequency, additional rejection will occur at the higher harmonics.

The resolution is enhanced to the extent that the spectral components at the FM fundamental and its harmonics are rejected. Since the FM fundamental and its harmonics are of approximately equal magnitude, the alias of the filtered FM fundamental may be expected to dominate the quantization noise.

Since the output of the filter is decimated to the accelerometer output frequency, filter outputs at over half the accelerometer output sample frequency (1/nT) will be aliased back into the signal baseband. However, the notches at all harmonics of the accelerometer output frequency insure that there will be no aliasing to DC (i.e. steady-state errors). Because the filter cannot alias to DC, the aliases will manifest themselves as zero-mean (unbiased) error. For a frequency-output accelerometer such as the VQA with a sensitivity of approximately 10 Hz/g, the incremental velocity resolution, using this particular embodiment, is improved from approximately one m/sec to approximately one mm/sec.

FIG. 7 shows the phase response of the digital FM demodulator in this example. The phase is linear and passes through 180 degrees at approximately half the accelerometer output sample frequency.

It is apparent from the foregoing that a new and improved digital FM demodulator and method have been provided. While only certain presently preferred embodiments have been described in detail, as will be apparent to those familiar with the art, certain changes and modifications can be made without departing from the scope of the invention as defined by the following claims.

I claim:

1. In a system for demodulating an FM input signal having a frequency $f_i$:

a zero-crossing detector operating synchronously at a sampling frequency $f_s$ greater than $f_i$ and a sampling period T for detecting zero crossings of the input signal and generating a pulse for each zero-crossing detected;

means responsive to the pulses from the zero-crossing detector for generating a binary pulse stream containing a predetermined number of binary pulses in response to each pulse from the zero-crossing detector; and means for digitally filtering the binary pulse stream to provide an output signal corresponding to the average frequency and incremental phase of the input signal over a sampling period nT, where n>1 and the sampling period nT is asynchronous with the zero-crossings of the input signal.

2. The system of claim 1 wherein the zero-crossing detector comprises:

a comparator for converting the input signal to a binary signal;

means for sampling the binary signal at the frequency $f_s$; and an edge detector responsive to the sampled signal for generating a pulse for each zero-crossing of the input signal.

3. The system of claim 1 wherein the means for generating the binary pulse stream comprises an m-shot pulse generator.

4. The system of claim 1 wherein the means for digitally filtering the binary pulse stream comprises a comb decimation filter.

5. The system of claim 4 wherein the comb decimation filter comprises a counter for counting the binary pulses;

an add-accumulator having k−1 stages for adding and accumulating the count from the counter, where k is a positive integer>1;

a reset-accumulator for adding and accumulating the output of the add-accumulator during each sampling period nT and resetting at the end of each sampling period; and a back-differencer having k stages responsive to the output of the reset-accumulator for providing an output signal corresponding to the difference between outputs of the reset-accumulator in successive sampling periods.

6. The system of claim 1 wherein the means for digitally filtering the binary pulse stream includes:

an up/down counter having an up counting input to which the binary pulse stream is applied;

a divide-by-p counter for dividing down pulses occurring at the frequency $f_s$ to pulses occurring at a frequency $f_s/p$, where p is a positive integer;

means for applying the pulses from the divide-by-p counter to a down counting input of the up/down counter;

a reset-accumulator for adding and accumulating the output of the up/down counter during each sampling period nT and resetting at the end of each sampling period; and a back-differencer responsive to the output of the reset-accumulator for providing an output signal corresponding to the difference between outputs of the reset-accumulator in successive sampling periods.

7. The system of claim 6 wherein the means for generating the binary pulse stream comprises an m-shot pulse generator for providing m pulses in response to each pulse from the zero-crossing detector and a divide-by-q counter for dividing the pulses from the m-shot pulse generator by q, where q is a positive integer.

8. The system of claim 7 wherein the integer p is selected to make $f_s/p$ substantially equal to the frequency of the pulses from the divide-by-q counter.

9. In a method of demodulating an FM input signal having a frequency $f_i$, the steps of:

synchronously detecting zero-crossings of the input signal in a zero-crossing detector by sampling the signal at a sampling frequency $f_s$ greater than $f_i$ and a sampling period T and generating a pulse for each zero-crossing detected;

generating a binary pulse stream containing a predetermined number of binary pulses in response to each pulse from the zero-crossing detector; and digitally filtering the binary pulse stream to provide an output signal corresponding to the average frequency and incremental phase of the input signal over a sampling period nT, where n>1 and the sampling period nT is asynchronous with the zero-crossings of the input signal.

10. The method of claim 9 wherein the zero-crossings are detected by:

converting the input signal to a binary signal;

sampling the binary signal at the frequency $f_s$; and monitoring the sample signal with an edge detector.

11. The method of claim 9 wherein the binary pulse stream is generated by triggering an m-shot pulse generator in response to each zero-crossing pulse.

12. The method of claim 9 wherein the binary pulse stream is filtered with a comb decimation filter.

13. The method of claim 9 wherein the binary pulse stream is filtered by:

counting the binary pulses in a counter;

adding and accumulating the count from the counter in an add-accumulator having k−1 stages, where k is a positive integer>1;

adding and accumulating the output of the add-accumulator in a reset-accumulator during each sampling period nT, the reset-accumulator being reset at the end of each sampling period; and applying the output of the reset-accumulator to a back-differencer having k stages to provide an output signal corresponding to the difference between outputs of the reset-accumulator in successive sampling periods.

14. The method of claim 9 wherein the binary pulse stream is filtered by the steps of:

applying the binary pulse stream to the up counting input of an up/down counter;

applying pulses occurring at a frequency $f_s/p$ to a down counting input of the counter, where p is a positive integer;

adding and accumulating the output of the up/down counter in a reset-accumulator during each sampling period nT, with the reset-accumulator being reset at the end of each sampling period; and applying the output of the reset-accumulator to a back-differencer to provide an output signal corresponding to the difference between outputs of the reset-accumulator in successive sampling periods.

15. The method of claim 14 wherein the binary pulse stream is generated by triggering an m-shot pulse generator in response to each pulse from the zero-crossing detector, and dividing the pulses from the m-shot pulse generator by q, where q is a positive integer.

16. The method of claim 15 wherein the integer p is selected to make $f_s/p$ substantially equal to the frequency of the pulses obtained by dividing the pulses from the m-shot pulse generator by q.

* * * * *